United States Patent
Lundquist et al.

(10) Patent No.: US 6,905,623 B2
(45) Date of Patent: Jun. 14, 2005

(54) PRECISE, IN-SITU ENDPOINT DETECTION FOR CHARGED PARTICLE BEAM PROCESSING

(75) Inventors: Theodore R. Lundquist, Dublin, CA (US); Kenneth R. Wilsher, Palo Alto, CA (US)

(73) Assignee: Credence Systems Corporation, Milpitas, CA (US)

( * ) Notice: Subject to any disclaimer, the term of this patent is extended or adjusted under 35 U.S.C. 154(b) by 132 days.

(21) Appl. No.: 10/288,896

(22) Filed: Nov. 6, 2002

(65) Prior Publication Data

US 2003/0132196 A1 Jul. 17, 2003

Related U.S. Application Data

(63) Continuation-in-part of application No. 09/738,826, filed on Dec. 15, 2000, now abandoned.

(51) Int. Cl.[7] .............................................. C03C 25/68
(52) U.S. Cl. ............................ 216/54; 216/58; 216/59; 216/61; 216/66; 216/67
(58) Field of Search ............................. 216/54, 58, 59, 216/61, 66, 67

(56) References Cited

U.S. PATENT DOCUMENTS

| | | | |
|---|---|---|---|
| 5,140,164 A | | 8/1992 | Talbot et al. ............. 250/492.2 |
| 5,821,549 A | | 10/1998 | Talbot et al. ............... 250/307 |
| 5,948,217 A | | 9/1999 | Winer et al. ........... 204/192.34 |
| 6,069,366 A | | 5/2000 | Goruganthu et al. ... 250/559.27 |
| 6,225,626 B1 | * | 5/2001 | Talbot et al. ............... 250/307 |
| 6,285,036 B1 | * | 9/2001 | Goruganthu et al. ... 250/559.27 |
| 6,288,357 B1 | * | 9/2001 | Dyer ..................... 219/121.41 |
| 6,355,494 B1 | | 3/2002 | Livengood et al. ........... 438/14 |
| 6,388,334 B1 | * | 5/2002 | Birdsley ..................... 257/778 |
| 6,452,209 B2 | * | 9/2002 | Vallett .......................... 257/48 |
| 6,806,166 B1 | * | 10/2004 | Birdsley et al. ............ 438/459 |

OTHER PUBLICATIONS

Nicholas Antoniou, et al: Control of Localized Access to Circuitry Through the Backside Using Focused Ion Beam Technology, J. Vac. Sci. Technol. B 17(6), Nov. Dec. 1999 (pp. 2730–2733).

* cited by examiner

Primary Examiner—Nadine G. Norton
Assistant Examiner—Binh X. Tran
(74) Attorney, Agent, or Firm—Deborah Wenocur; Naomi Obinata

(57) ABSTRACT

A system and method for determining precisely in-situ the endpoint of halogen-assisted charged particle beam milling of a hole or trench in the backside of the substrate of a flipchip packaged IC. The backside of the IC is mechanically thinned. Optionally, a coarse trench is then milled in the thinned backside of the IC using either laser chemical etching or halogen-assisted charged particle beam milling. A further small trench is milled using a halogen-assisted charged-particle beam (electron or ion beam). The endpoint for milling this small trench is determined precisely by monitoring the power supply leakage current of the IC induced by electron-hole pairs created by the milling process. A precise in-situ endpoint detection signal is generated by modulating the beam at a reference frequency and then amplifying that frequency component in the power supply leakage current with an amplifier, narrow-band amplifier or lock-in amplifier. The precise, in-situ, endpoint signal is processed and displayed for manual or automatic precise in-situ endpoint detection. This approach avoids or minimizes unintentional damage or perturbation of the active diffusion regions in the IC. A range of further operations on the IC can then be performed.

18 Claims, 9 Drawing Sheets

Flow Diagram

Fig 1  Not to scale

Fig 2  Not to scale

Fig. 4 Flow Diagram

FIG. 5 shows a schematic of the system

FIG. 6 shows a waveform diagram representing the improved end-point signal

FIG 7 shows beam material interaction volume cross-section

PRECISE, IN-SITU ENDPOINT DETECTION FOR CHARGED PARTICLE BEAM PROCESSING

REFERENCE TO RELATED APPLICATION

This application is a Continuation-In-Part of U.S. application Ser. No. 09/738,826 filed on Dec. 15, 2000 now abandoned. The disclosure of this prior application is hereby incorporated herein by reference.

FIELD OF THE INVENTION

This invention relates to methods and apparatus for locating, exposing and operating on flipchip mounted IC (Integrated Circuit) circuit elements for debug, diagnosis, probe-point creation, prototype modification and failure analysis.

BACKGROUND OF THE INVENTION

Semiconductor technology and the associated packaging and diagnostic techniques have advanced dramatically over the past decade. Many of the most advanced and complex logic IC's such as microprocessors, digital signal processors and so-called SOC's (System-On-a-Chip) are today commonly packaged facedown using flipchip mounting technology on a substrate rather than conventional face-up wire bonded packaging. Flipchip packaging has many advantages including accommodation for very high I/O pin counts, low inductance signal-paths for high speed signals, low resistance power distribution, small form-factor and potentially low-cost packages.

However, flipchip packaging presents substantial challenges for design debug, prototype modification and failure analysis as the active circuitry is directly mated with the package substrate and cannot readily be accessed for probing or modification without compromising the package signal integrity (thus severely hindering any functional electrical diagnostic work and particularly at-speed analysis).

Diagnostic electrical probing and prototype repair or modification remain critical parts of the commercial race to get new IC products to market quickly. Techniques exist for through-the-substrate probing and modification of flipchip packaged IC's. These include pulsed laser IR timing waveform probing through a thinned silicon substrate using products such as the IDS 2000 and the IDS 2500 from NPTest, Inc, of San Jose, Calif. Other techniques include use of FIB (Focused Ion Beam) with halogen chemistry acceleration for cutting trenches and holes in IC substrates using products such as the IDS P3X also from NPTest of San Jose, Calif.

Improvements in cost, complexity and ease of operation of these techniques are highly desirable. As the number of metal interconnect layers has increased and with the prevalence of using the top metal layers as power-planes, even some conventionally wired bonded IC's are now being probed, diagnosed and modified using techniques adapted for use through the backside of the IC substrate.

Processes for backside Focused Ion Beam (FIB) operations have been developed and are in use at a few advanced IC manufacturers today. Examples of such processes are described in U.S. Pat. No. 5,821,549 (hereafter '549) to Talbot et al. "THROUGH THE SUBSTRATE INVESTIGATION OF FLIP-CHIP IC'S", issued Oct. 13, 1998, and in U.S. Pat. No. 6,069,366 (hereafter '366) to Goruganthu et al. "ENDPOPINT DETECTION FOR THINNING OF SILICON OF A FLIPCHIP BONDED INTEGRATED CIRCUIT", issued May 20, 2000, both of which are incorporated herein by reference. These processes typically use a flow similar to the one that follows:

preparation of a substrate by thinning with mechanical polishing or sometimes chemical mechanical polishing from approximately 800 um thickness down to approximately 20–200 $\mu$m.

coarse cutting of a trench with Laser Chemical Etching (LCE) to within approximately 5–20 $\mu$m of the active front surface of the silicon coarse, chemically assisted FIB milling of a smaller trench within the LCE trench to within one to a few microns of the active diffusion regions (the chemical assistance is typically achieved using halogen-based chemistry injected into the vacuum chamber close to the operation site)

FIB sputter removal or fine chemically assisted FIB milling between active diffusion regions or active devices including transistors, diodes, etc., to provide access to one or more circuit elements, and finally probing, cutting, depositing, or connecting signal paths as required.

Two portions of this process are particularly error-prone, specifically the ability to stop the coarse and fine milling steps before active diffusion regions are breached or destroyed, and the positioning of the fine FIB milling operation to ensure again that active diffusion regions are not accidentally damaged. These errors in milling and positioning usually result in a non-functional or impaired device. Depending on the complexity of the process and the skill of the operator, success rates for this type of operation are relatively low and range from 50% to 90%. As the complexity and number of steps in a given modification sequence increases, the overall yield decreases as the product of the yields of each of the individual steps and quickly tends to zero for many of the more complex sequences.

There are a number of techniques for FIB operation endpoint detection in use, including monitoring sample stage current, monitoring a secondary electron detector signal, monitoring a secondary ion detector signal, monitoring a secondary ion mass spectrometer signal and even monitoring a photo-emission signal from excited secondary particles. These techniques all rely on a signal change at a material boundary or interface and are difficult to apply to backside operations where milling often must be reliably stopped before diffusion regions are perturbed, where there is no meaningful materials interface but merely a change in doping impurity concentration.

Other endpoint detection techniques are described in U.S. Pat. No. 5,140,164 to Talbot et al. "IC MODIFICATION WITH FOCUSED ION BEAM SYSTEM" issued Aug. 18, 1992, and in U.S. Pat. No. 5,948,217 to Winer et al. "METHOD AND APPARATUS FOR ENDPOINTING WHILE MILLING AN INTEGRATED CIRCUIT" issued Sep. 7, 1999. The approaches taught in these patents have the disadvantage of requiring that a signal (AC in the first case and DC in the second case) be applied to the circuit element being accessed.

Patent '366 presents one approach for more reliably stopping milling prior to exposing active diffusions using Optical Beam Induced Current (OBIC). A bright laser light source is used to sense the remaining material thickness. Laser light photons create electron-hole pairs in the substrate. As the milling process approaches the active diffusion regions, an increasing number of electron-hole pairs are generated in or near the active diffusion region of transistors and results in an increased leakage or photo-current that is monitored through the power supply pins of the IC being operated on. Based on characterization and experience, the operator is then able to perform more accurate endpoint detection and reliably stop the milling process prior to active diffusion region damage by periodically monitoring the optically induced leakage current.

The disadvantage of this approach is the need for a powerful laser light source. Patent '366 references the use of a relatively high powered 4W green laser (with a photon energy greater than the silicon band gap in order to create electron-hole pairs in the bulk silicon). Not all of this power would be focused onto the operation area. Although in principle the laser could be made to illuminate the operation site simultaneously with the milling operation, in practice this is quite challenging and commercial FIB systems today are not so equipped. Another challenge is gallium staining of the milled surface resulting in variations of the amount of light transmitted. Yet another challenge is the laser light interfering with, swamping or possibly even damaging the sensitive charged particle detector in the FIB system. From a practical standpoint today, either the IC or light source is periodically moved to monitor changes in the OBIC signal. This approach is cumbersome and time consuming and does not readily lend itself to a practical or fast closed loop endpoint detection system.

Patent '366 also suggests the use of an ion Beam Induced Current (BIC) signal for endpoint detection. The ion BIC signal from a typical ion beam milling current of approximately 1–10 nA is very much smaller than the OBIC signal produced by a 4W laser, and extremely poor signal-to-noise ratio has so far precluded its use in all but experimental situations.

SUMMARY OF THE INVENTION

Embodiments of the invention offer processes and systems for reliably operating on IC's through a susbstrate, cutting trenches or holes to expose electrical features of an IC through the substrate without perturbing or damaging neighboring structures, with lower cost and less complexity, greater reliability and improved ease of use over previous approaches. One such process for cutting a hole or trench in a backside of the substrate of an IC with precise in-situ endpoint detection comprises:
  a. coarse thinning of the backside of the substrate;
  b. milling a trench in a predetermined location of the backside of the substrate with a chemically-assisted charged particle beam;
  c. monitoring an amplified electrical endpoint signal induced by the beam from the IC during the milling and
  d. stopping the milling when the endpoint signal reaches a predetermined state.

A preferred embodiment includes modulating or pulsing the charged particle beam, (electron beam or ion beam, preferably a gallium ion beam) at a reference frequency and using a band-pass amplifier at the reference frequency or a lock-in amplifier connected to the reference frequency to amplify the signal.

Another preferred embodiment of the invention is a system for milling a hole or trench with precise in-situ endpoint detection in a backside of a substrate of an IC, the system comprising:
  a. a charged particle beam generating column and secondary particle detector subsystem, the column being positioned in a vacuum system, and being equipped with a beam-blanker for pulsing the beam at a reference frequency;
  b. an XY stage for providing relative motion between a charged particle beam generated by the column and an IC held substantially perpendicular to the path of the charged particle beam, the XY stage for use in positioning the ion beam and the IC relative to one another;
  c. a halogen-based chemistry injector disposed to deliver halogen-based gas to an area of the backside of the substrate where the hole or trench is milled with the beam;
  d. a lock-in amplifier disposed to monitor the reference frequency in the power supply connections of the IC;
  e. the amplifier output connected to a display or data processing apparatus to monitor a milling endpoint signal.

Other objects, features and advantages of the present invention will become apparent with reference to the drawings, the following description of the drawings and the claims.

BRIEF DESCRIPTION OF THE DRAWINGS

FIG. 3 depicts a series of diagrams schematically representing a sequence of operations illustrating a process of applying this invention:

DETAILED DESCRIPTION OF THE INVENTION

In the following detailed description of the preferred embodiments and other embodiments of the invention, reference is made to the accompanying drawings. It is to be understood that those skilled in the art will readily see that other embodiments and changes may be made without departing from the scope of the invention.

Figure 1:
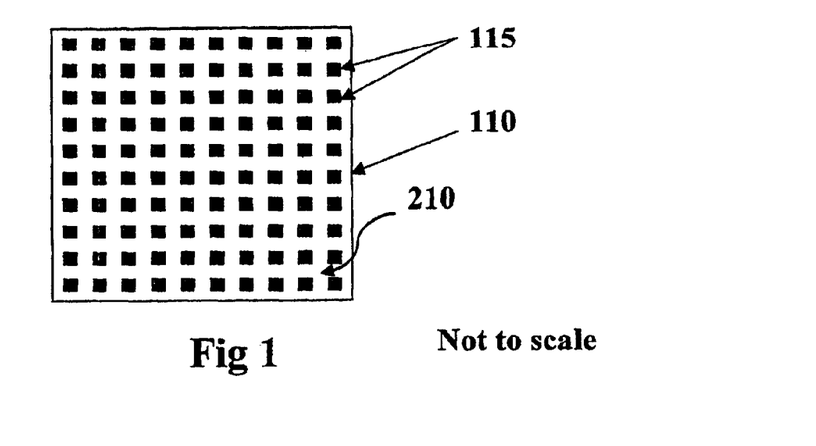
FIG. 1 depicts an active surface or face-up IC with solder bumps prepared for flipchip mounting.

FIG. 1 depicts a schematic view of an IC 110 designed to be flipchip mounted. The top or active surface 210 of the IC 110 is covered with solder bumps 115. During the packaging process these solder bumps 115 are soldered directly to a similar array of pads or bumps 226 on the package substrate. Because much of the active surface 210 of the IC 110 is covered with the solder bumps 115, access to the circuit elements below (not shown) is limited for probing and modification. In addition, in order to perform at-speed analysis, it is usually required to take advantage of the high speed interconnection provided by the flipchip package substrate to electrically stimulate the IC 110, and thus the IC 110 must remain attached to its package substrate for diagnostic probing. Furthermore, it is also desirable to leave IC 110 attached to the package substrate during modification, since removal increases the risk of damage to the IC.

Figure 2:
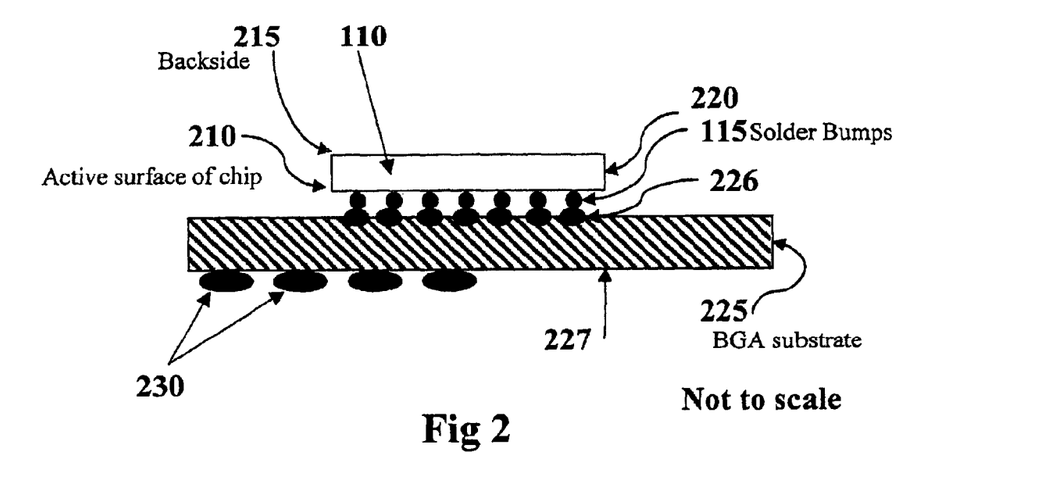
FIG. 2 depicts a cross-section of a flipchip packaged IC mounted active surface down on a BGA (Ball Grid Array) packaging substrate.

FIG. 2 depicts a cross-section of the IC 110 mounted on a flipchip Ball Grid Array (BGA) package substrate 225, with connections between the active surface 210 and the BGA substrate 225 made by solder bumps 115 and 226. BGA substrate 225 has solder balls 230 on its printed circuit board (PCB)-facing side 227 for mounting on a PCB (not shown). The active surface 210 of the IC 110 faces the package substrate 225 and is thus not accessible for diagnostic operations. A backside 215 of IC 110 is, however, clearly accessible for diagnostic operations with the IC 110 packaged in this manner. Initially, the backside 215 is unthinned. Backside 215 is first thinned using one or another standard, purely mechanical or chemical-mechanical sample preparation processes as described in patents '549 and '366. After thinning the backside 215, substrate 220 has thickness of approximately 20–200 $\mu$m (preferably about 50–150 $\mu$m). The thinned backside (not shown) is polished with diamond or other fine polishing medium, (well known in the art). This allows IR optical imaging through the substrate of the IC 110 circuit elements (not shown) to aid in precise navigation for locating circuit elements to be exposed or operated on.

FIG.'s 3a through 3d depict a sequence of schematic cross-sections representing the series of operations performed from the IC backside that are required in accordance with preferred embodiments of the invention to gain access to IC circuit elements on the active surface (or front-side surface) of the IC without damaging or significantly perturbing the active diffusion regions of the IC.

Figure 3A:
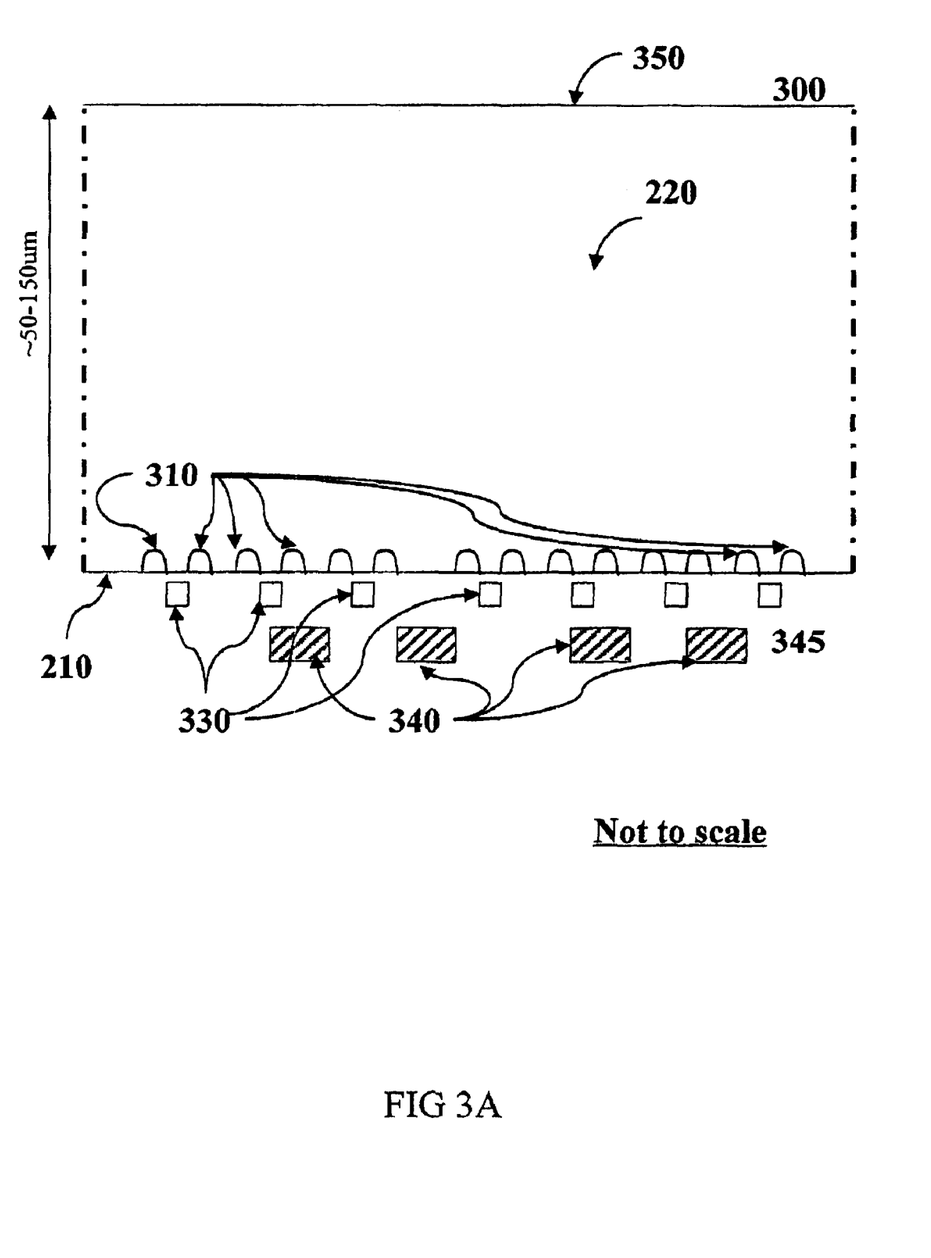
FIG. 3a depicts a portion of a schematic cross-section of a flipchip IC with a mechanically thinned and polished backside ready for further operations.

FIG. 3a depicts a partial cross-section (not to scale) of a section of thinned IC 300. The active surface 210 of thinned IC 300 has one or a plurality of active diffusion or implant regions 310. These active diffusion regions 310 when combined with conductive gates 330 (usually made of polysilicon), form transistors, a primary active circuit element of CMOS IC's. Metal-1 interconnects 340 (usually made of copper, tungsten or aluminum) show partially the first of several additional interconnect layers (not fully shown) that form the IC 300. Gates 330 and interconnects 340 are surrounded by dielectric 345. IC substrate 220 has been thinned from the backside with a relatively coarse and quick material removal process and then polished to form polished surface 350. Note that CMOS IC's also include well diffusions (not shown) that allow use of both n-type and p-type diffusions (the p-type diffusions within n-well diffusions) to facilitate implementation of complementary n-channel transistors (NMOS) and p-channel transistors (PMOS).

The lines designating the diffusion regions 310 mark the approximate location of pn junctions (not shown) formed between the diffusion regions 310 and the IC substrate 220. At each such junction there is a carrier depletion region (not shown) with which electron-hole pairs can interact to produce a leakage current when the junction is reverse biased. This mechanism is used by preferred embodiments of the invention for endpoint detection.

Figure 3B:
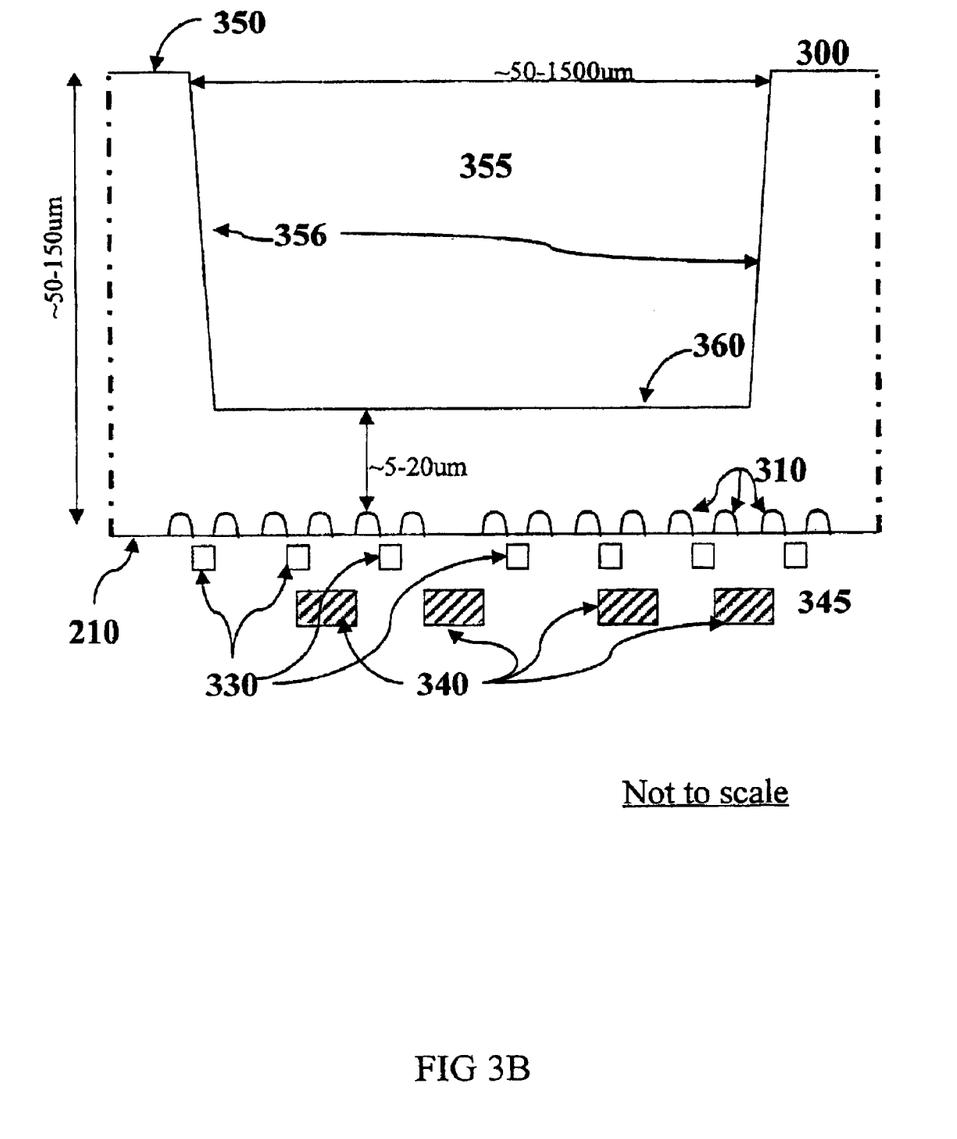
FIG. 3b depicts a portion of a schematic cross-section of an IC showing an LCE or FIB trench cut through the mechanically thinned backside of the substrate of the flipchip IC.

FIG. 3b depicts thinned IC 300 with a first coarse trench 355 milled in polished surface 350. Coarse trench 355 has a bottom 360 and sidewall 356 with one or a plurality of sides (two of which are shown). LCE is a preferred approach to milling coarse trench 355. A laser system suitable for carrying out this process is the Silicon Editor™ made by Revise Inc. of Burlington, Mass. This step can also be carried out more slowly with a chemically-assisted charged particle beam system such as the NPTest "IDS P3X" FIB system. Xenon difluoride (XeF2) is a preferred halogen-based chemical for assisting in FIB material removal.

The actual size of coarse trench 355 will vary depending on the thermal and other properties of IC 300 and the goal of the operation. A width and breadth in the range of approximately 50–1500 $\mu$m is typical. Note that with most milling processes the trench sidewall 356 will not be perfectly smooth or vertical. The intent of this coarse trench 355 is to provide good access for further, more precise operations in bottom 360 of coarse trench 355. It is often important that the coarse milling process stop before damage or exposure of the active diffusion regions 310 on the active surface 210. The milling of coarse trench 355 can be stopped based on timing and knowledge of the material removal rate, although actual material rates do vary somewhat from sample to sample and depending upon system parameters such as focus, gas pressure, beam current and beam energy variations, etc. The bottom 360 of coarse trench 355 will be approximately in the range of 2–20 $\mu$m (preferably about 5–15 $\mu$m) away from the active diffusion regions 310 at this point in the process, or closer if the milling process is very well controlled.

Figure 3C:
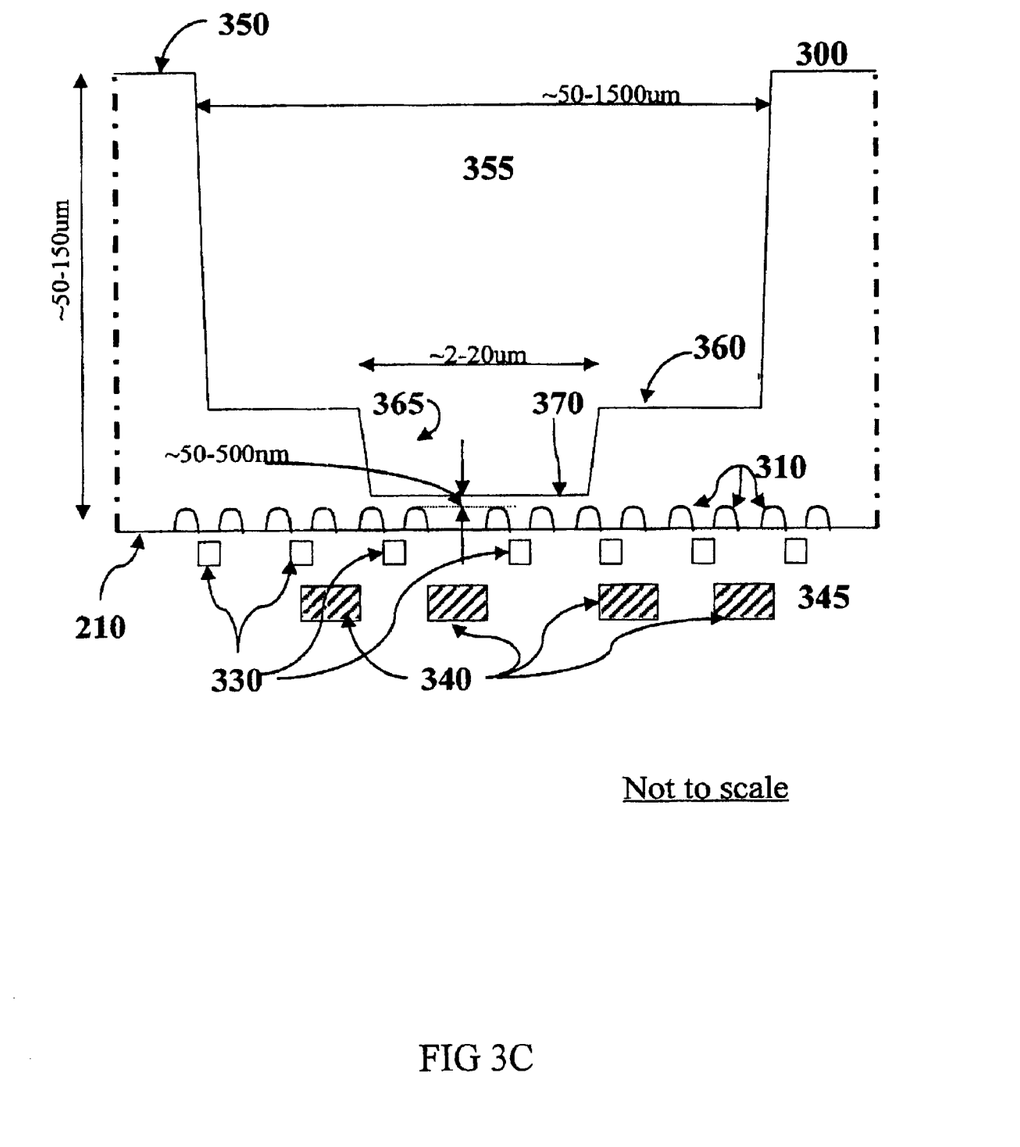
FIG. 3c depicts a portion of a schematic cross-section of the flipchip IC with a further smaller trench cut within the LCE trench, where cutting has stopped accurately prior to damaging active diffusion regions using the charged particle beam induced power supply leakage current approach of the present invention.

FIG. 3c depicts thinned IC 300 with a further second small trench 365 milled in bottom 360 of coarse trench 355. The width of this small trench 365 is typically 2–20$\mu$m, but can actually extend across the whole trench floor if the milling process is very well controlled. The base surface 370 of small trench 365 is approximately 50–500 nm (preferably about 50–20 nm) away from the active diffusion regions 310, preventing damage or minimizing perturbation to those regions. The small trench 365 can be cut with either a chemically-assisted or halogen-assisted electron beam, or with FIB. XeF2 is the preferred halogen precursor and provides material removal rate acceleration factors approximately in the range of 100–1000 X for bulk silicon with a gallium ion beam having a beam energy of approximately 10–50 keV and preferably about 30 keV.

Figure 5:
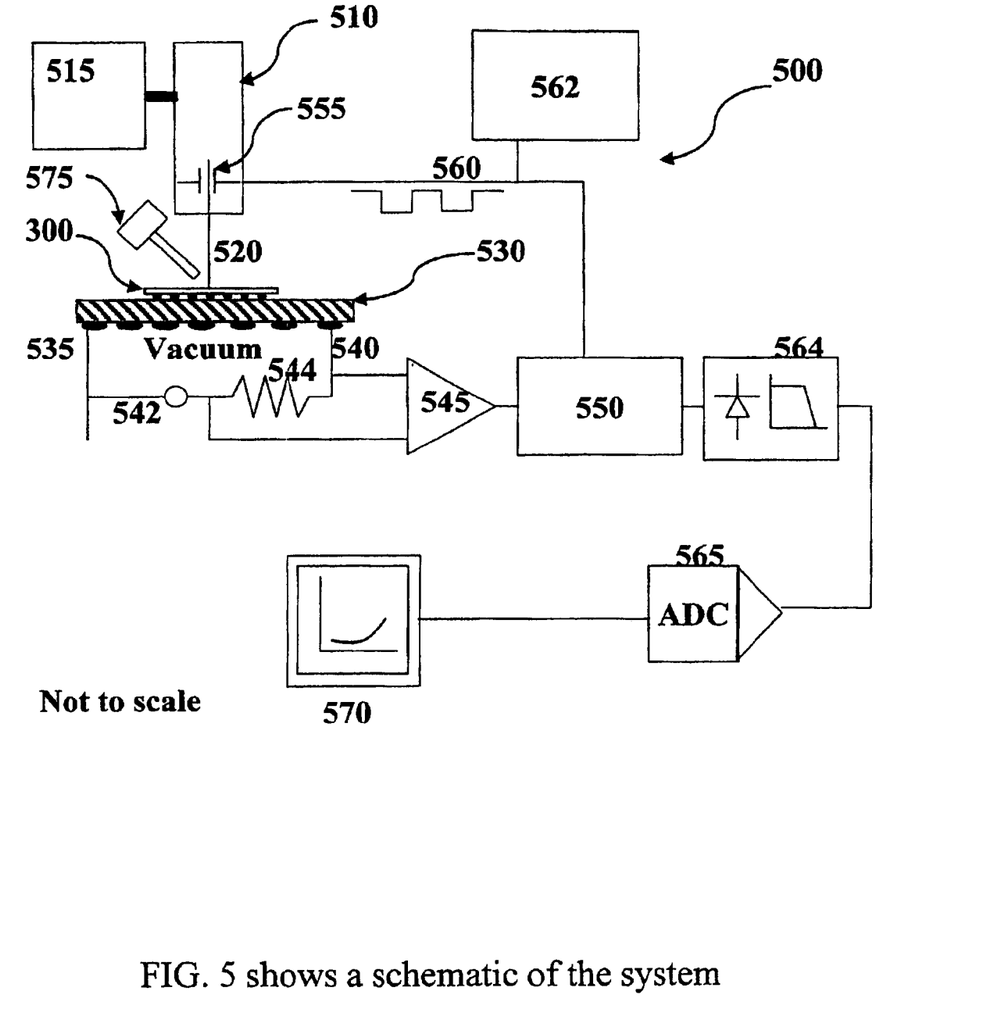
FIG. 5 depicts a schematic of the system apparatus.

In this embodiment, it is imperative that the milling process be stopped before damage is caused to the active diffusion regions 310. FIG. 5, more fully described below, depicts a schematic diagram of a system of a preferred embodiment of the present invention for milling a hole or trench in an IC. In order to achieve precise, reliable, in-situ endpoint detection, the power pins (Vdd 535 and Vss 540) of IC 300 are connected to a power supply 542. An amplifier 550 monitors changes in power supply leakage current through the IC power connections or pins 535 and 540. The amplifier 550 may be a band limited, narrow-band or band-pass amplifier, and is preferably a lock-in amplifier.

During milling, the beam is modulated at a predetermined reference frequency 560 in the range of approximately 10 Hz to a MHz. This may be accomplished by periodically pulsing or blanking the beam at the reference frequency. For example, the beam may be pulsed for a few seconds once per minute during the milling process. The purpose of periodically modulating the beam in this manner is to allow the use of amplifier 550 to improve the signal-to-noise ratio of the resulting power supply leakage current signal. Without this modulation approach, the resulting signal is very difficult to interpret due to poor signal-to-noise ratio, which will result in critical errors in endpoint detection and unwanted damage or perturbation of diffusion region 310 of IC 300.

The amplifier 550 is set up to monitor the amplitude of the predetermined reference frequency 560 component in the power supply leakage current and to display its value or state for use in precise endpoint detection.

An alternate method of modulating the beam at the predetermined reference frequency is to generate the reference frequency from the raster scanning of the beam 520 during milling, and to monitor that frequency component with the amplifier 550. The signal may optionally be processed before being displayed for endpoint detection.

Figure 7:
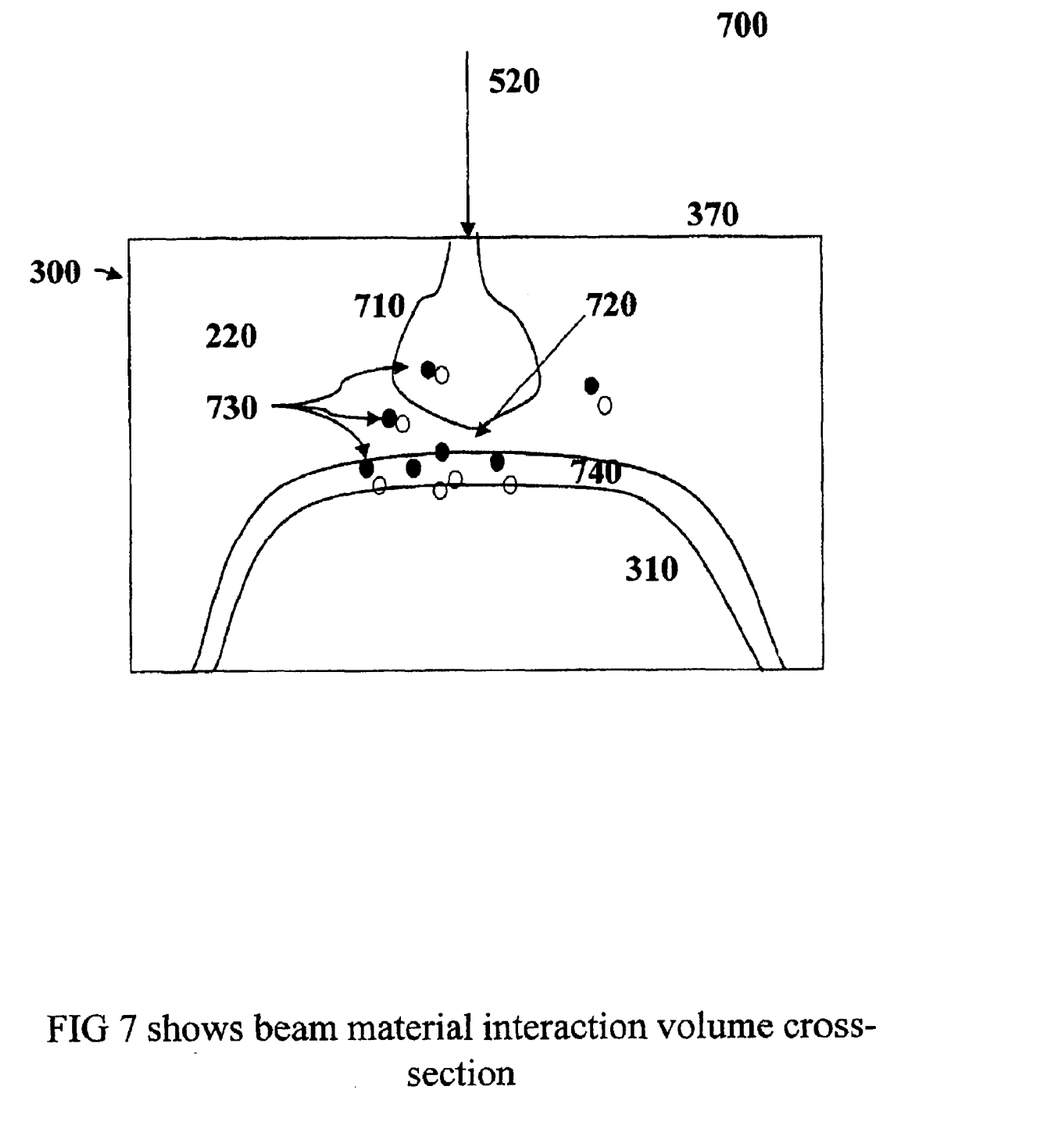
FIG. 7 depicts a charged particle beam material interaction volume cross-section.

FIG. 7, also more fully described below, depicts a schematic cross-section 70 of the beam material interaction volume 710. During the milling process, electron-hole pairs 730 are generated in and near the charged particle beam material interaction volume 710 (hereafter interaction volume) within the substrate 220 where the beam 520 impinges on the base surface 370. During milling, when the base surface 370 is far away from the active diffusion region 310, the beam-induced electron-hole pairs 730 recombine within the substrate 220 without inducing a leakage current, and are of little consequence.

However, as the milling process progressively approaches one or more of the active diffusion regions 310, some portion of the electron-hole pairs 730 will enter the depletion region 740 and result in an increased leakage current through one or more of the active diffusion regions 310 that are part of transistors that are in the "off" or non-conducting state. As the milling process progresses, an increasing number of electron-hole pairs 730 reach active diffusion regions 310 and result in progressively higher leakage currents.

Precise in-situ endpoint detection is achieved by modulating, e.g., by periodically pulsing or blanking, the beam 520 at a predetermined frequency and interpreting the output of the amplifier 530, preferably processed and displayed. When the amplifier 550 output reaches a predetermined value or state, or when the amplifier 550 output has changed by a predetermined proportion, the milling process is stopped. This predetermined amount or proportion is established by characterization of the particular semiconductor manufacturing process used to make the IC 300. Characterization of this kind is well known in the art and will typically be accomplished by using a FIB system to cross-section trial trenches.

The use of a relative change or ratio change rather than an absolute value or an absolute change in determining the endpoint is a more robust and easier to use technique. This is because the relative measure automatically factors in differences from operation to operation caused by the different size and number of active diffusion regions 310 under the smaller trench 365. Various resulting or processed signals can be displayed for the operator to view including but not limited to the actual amplifier output, a rectified version of the output, a smoothed rectified signal, the change of any of these processed signals relative to the start or other reference amplitude.

Also, a predetermined threshold for any one or combination of these displayed signals can be employed to automate endpoint detection. The milling process proceeds until the predetermined threshold or value is reached or exceeded, and then milling is stopped manually or automatically. The calculations required to display these different signals can be performed in hardware or in software by a PC, hand-held computing device, or microprocessor, with appropriate programming stored in computer readable form, as are well known in the art.

In other embodiments, the coarse trench milling step may be obviated by mechanically thinning and polishing the whole backside surface of the IC so that polished surface 350 is approximately 5–30 μm from the active surface 210. Small trench 365 may then be milled directly into polished surface 350.

Figure 3D:
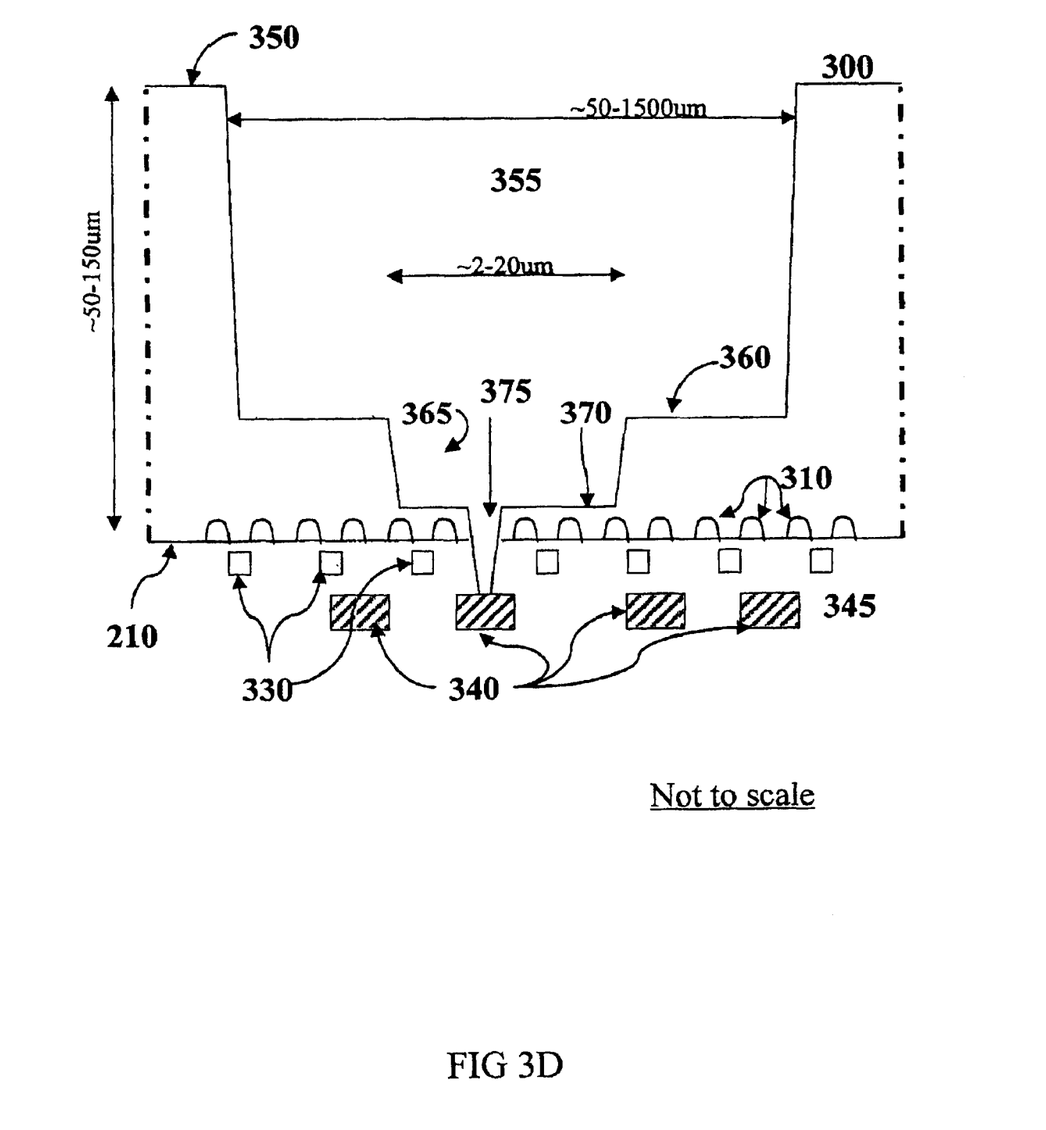
FIG. 3d depicts a portion of a schematic cross-section of the flipchip IC with a hole cut within the smaller trench to expose a metal-1 interconnect without damaging neighboring structures.

FIG. 3d depicts IC 300 with a hole 375 cut through base surface 370 of smaller trench 365 to gain access to or to contact a circuit element such as metal-1 interconnects 340. In many operations, avoiding damage to, or minimizing perturbation of the neighboring active diffusions regions 310 is critical to success. In order to ensure that the milling operation is precisely located where it will not interfere with active diffusion regions 310, accurate positioning or navigation information is required. This can be achieved blind with a very accurate interferometer stage, or preferably by acquiring and accurately locally aligning an infra-red (IR) optical image of the region as described in patent '549. Since the interconnect 340 is being exposed during this operation, conventional endpoint detection techniques such as monitoring the secondary electron signal work well. This is because there is a materials interface (not shown) between the dielectric 345 and interconnect 340 that results in a change in the secondary electron signal which can be readily monitored. Once the interconnect 340 is exposed, any one of a range of further operations can be completed, including but not limited to making a probe-point or connection to another signal interconnect by lining the walls of the hole with beam-induce deposition of an insulator and then depositing a conducting material, as are well known in the art. Interconnect 340 can also be cut if required by continuing the milling process until the interconnect is completely severed. Those of skill in the art will recognize that this precise in-situ endpoint detection technique can be used to aid in a wide variety of operations on IC's.

Figure 4:
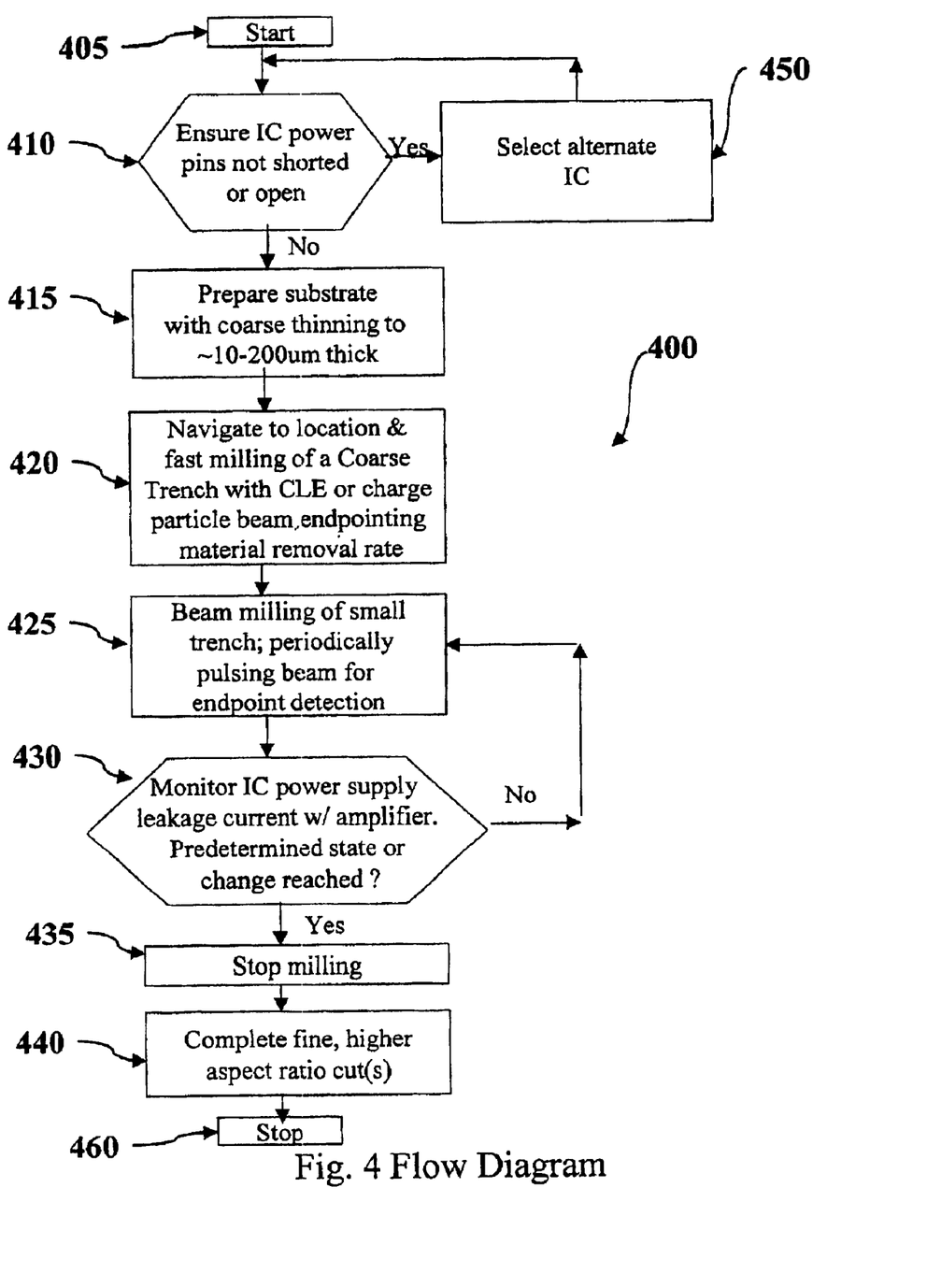
FIG. 4 depicts a flow diagram of an embodiment of the process.

FIG. 4 depicts a preferred embodiment of the process of the present invention. Flow diagram 400 depicts the process for milling a hole within a trench in the backside of the substrate of an IC with precise in-situ endpoint detection to prevent damage or minimize perturbation of sensitive diffusion regions.

The process starts at step 405. Step 410 comprises ensuring that the precise in-situ endpoint signal of the present invention will be available, by ensuring that the IC power supply connections or pins are not shorted together nor open circuit. If there is a short or open circuit, the flow diagram directs the process to step 450 to select an alternate IC and then back to step 410.

If the power supply connections or pins are not shorted or open, the flow diagram directs the process to step 415 which comprises coarsely thinning the backside of the IC substrate to a thickness in the range of approximately 10–200 μm, preferably in the range of 50–150 μm depending on the IC thermal requirements and other properties. Thinning and optically finishing the backside surface of flipchip IC's is a standard failure analysis technique in widespread use and well known in the art. The next step 420 comprises navigating to the area of the operation and cutting a coarse trench with LCE. In another embodiment the cutting of the trench is accomplished more slowly with a halogen-assisted charged particle beam (e-beam or ion beam). The milling time and thus endpoint for the coarse trench is based on approximate material removal rates and the dimensions of the trench, with a reasonable safety margin added to ensure against damage and to account for some variability in the IC, the flatness of the prior thinning step, and the milling equipment.

Step 425 comprises milling a small trench within the coarse trench, and using a precise, in-situ endpoint signal to accurately stop before damaging active diffusion regions 310. The precise in-situ end-point signal is generated by modulating the charged particle beam at a predetermined reference frequency and by monitoring that reference frequency component in the IC power supply leakage current with an amplifier and appropriate display means.

Step 430 comprises determining whether to stop the milling process when the precise, in-situ endpoint signal reaches or exceeds a predetermined value or state. The predetermined value or state is determined from pre-characterization of the process used to manufacture the IC and can be defined in several ways as already discussed—including but not limited to absolute value, absolute change, or relative change. If the predetermined state is not reached, the process loops back to step 425 where milling is continued. When the predetermined state or value is reached, the process proceeds to step 435 where the milling of the small trench is stopped by a milling cut-off.

Finally, in step 440, other operations including higher aspect ratio operations are completed to expose and gain access to circuit elements such as interconnects in the IC. These operations usually use conventional secondary electron-based end-point detection because of the clear material interface between the metal interconnect and the insulating interlayer dielectric. The process stops at step 460.

Returning to FIG. 5, system 500 comprises a charged particle beam generating column/secondary particle detecting subsystem 510 (hereafter column subsystem), with column control electronics 515 connected to column subsystem 510 to generate charged particle beam 520. Beam 520 impinges upon thinned IC 300 mounted on package substrate 530. A movable XY stage (not shown) is used to provide relative motion between the column subsystem 510 and the thinned IC 300—package substrate 530 combination. This may be accomplished in two ways. A first method is to have thinned IC 300 and package substrate 530 placed on a movable XY stage that is substantially perpendicular to beam 520. An alternative second method is to have the charged particle beam generating column mounted on a precisely movable XY stage. This method is described in U.S. Pat. No. 5,140,164 by Talbot et al., which is hereby incorporated by reference. Column subsystem 510, beam 520, IC 300, and substrate 530 along with a halogen gas injector 575 are mounted in a vacuum chamber which is not shown.

IC package substrate 530 has power supply connections Vdd 535 and Vss 540 that are connected to IC power supply 542. Current sense resistor 544 is in series with IC power supply 542. Buffer amplifier 545 has two differential inputs connected across current sense resistor 544, and its output connected to amplifier 550. Amplifier 550 can be a band-limited or bandpass amplifier or is preferably a lock-in amplifier such as model SR830DSP purchased from Stanford Research in Sunnyvale, Calif., or similar.

When amplifier 550 is a lock-in amplifier, it is also supplied with reference frequency signal 560 from reference frequency generator 562, which may also be connected to beam blanker 555 in column subsystem 510 for pulsing the beam at the reference frequency. Those of skill in the art will recognize that other methods and apparatus for modulating the beam may be used in place of beam blanker 555. Reference frequency 560 may not be required for some embodiments, for example amplifier 545 can be a narrow band amplifier whose center frequency is approximately the same as reference frequency 560.

The output of amplifier 550 is connected to rectifier and smoothing module 564, whose output in turn is connected to ADC (Analog to Digital Converter) 565, whose output is reported with indicator 570 which may be a display or means for reporting.

In other embodiments, amplifier 550 is a simple amplifier, broad-band amplifier, or narrow band-pass or band-limited amplifier where the band-pass or band-limits are tuned to pass the reference frequency components or it harmonics or sub-harmonics in the IC power supply leakage current. Reference frequency 560 may also be derived from a beam raster scan deflection signal used to raster scan the beam during imaging or milling or from harmonics or sub-harmonics of the raster scan signal.

The value of current sense resistor 544 is chosen depending on the type of IC being operated on and its typical power supply current requirements. Increasing the size of the resistor makes the detection technique more sensitive but can result in increasingly large voltage drops at the IC power supply connections 535 and 540 if the leakage current is high. Decreasing the value of current sense resistor 544 results in the reverse, less sensitivity in the endpoint signal but less voltage drop at the IC. Resistor values approximately in the range of 100 Ohms–1 Mohm can be used with a range of IC's, although higher or lower resistance values may be needed for very low or very high current IC's respectively.

Indicator 570 can be a simple voltmeter or oscilloscope. It can also be an intelligent display such as a PC or handheld computing device capable of implementing algorithms to improve the endpoint display sensitivity or with appropriate software to control and automate the complete milling and endpoint detection process. Algorithms for improving the endpoint signal include but are not limited to absolute amplitude change and relative amplitude change. In yet another embodiment, indicator 570 can be an audible signal generator, for example a smart volt or current meter that issues beeps of varying tone, or pulses of varying period to denote the signal. Alternatively a voice synthesizer reporting the signal audibly as a number or as state with respect to the predetermined state can be used.

Figure 6:
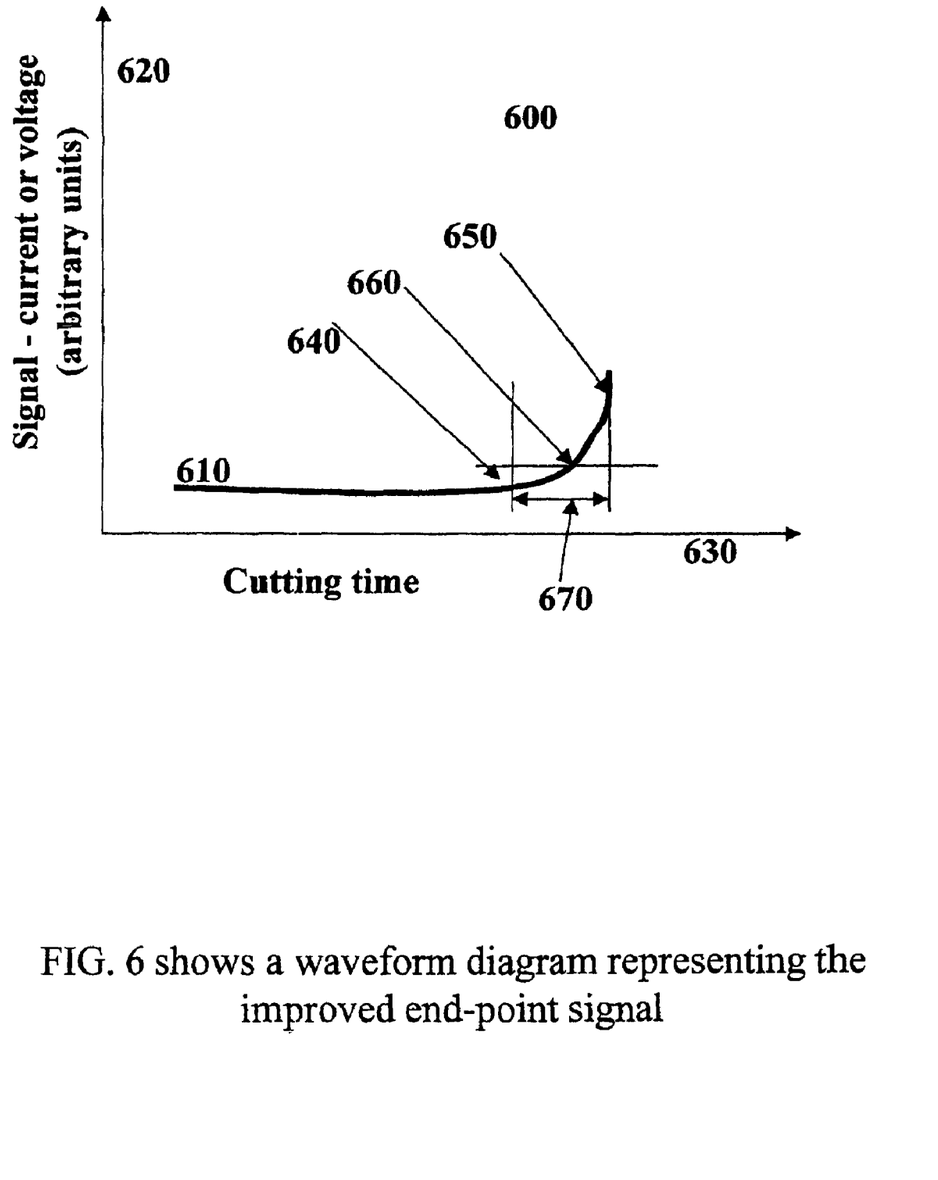
FIG. 6 depicts a waveform diagram representing the precise in-situ endpoint signal.

FIG. 6 depicts a typical waveform of the precise in-situ endpoint signal display 600. Signal 610 voltage or current is plotted against voltage or current 620 and cutting time 630. Point 640 on signal 610 indicates the start of the increase of the charged particle Beam Induced Current (BIC) change. Point 650 indicates a typical stopping point for the milling process determined by characterization of the IC's semiconductor manufacturing process, and point 660 is an intermediate point on the signal. Active range 670 indicates the range over which the BIC signal is actively changing—i.e., the interaction between electron-hole pairs and the depletion region associated with active diffusion regions 310.

Preferred embodiments of the invention include several methods of generating the endpoint signal that make interpretation easier and less dependent on the specific process and location of the operation. These embodiments include:

Direct display of the signal from the amplifier 550—this is the simplest and easiest to implement Display of a difference signal representing only the change in the value of the signal—this has the advantage of effectively subtracting out the background leakage current of the device Display of the ratio of the change in the signal to the start or background leakage current—this also has the advantage of being less dependent on variability in background leakage current.

Referring to FIG. 7 which depicts a schematic cross-section diagram 700 of the beam-material interaction volume: Beam 520 impinges during the milling process on the base surface 370 of substrate 220 of thinned IC 300. Beam interaction volume 710 is close to active diffusion region 310 at 720, which represents the approximate region near the diffusion region 310 for electron-hole pairs 730 to reach the depletion region 740 (at the boundary between substrate 220 and diffusion region 310) and contribute to power supply leakage current. 720 represents the approximate general region in which electron-hole pairs 730 generated by the beam-substrate interaction can result in increased power supply leakage when diffusion region 310 is in the appropriate reverse biased state. This is when diffusion region 310 is part of a transistor (not depicted in FIG. 7) whose gate is biased so that the associated transistor is in the "off" or non-conduction state, or when diffusion region 310 is part of, for example, an n-well which is usually reverse biased and thus is always able to contribute to power supply leakage current.

For a transistor diffusion region to contribute to leakage current, the transistor must be in the "off" state for this process to result in an increased power supply leakage current because of the structure of CMOS circuits. For example, in a CMOS inverter which is typically comprised of a PMOS transistor and an NMOS transistor connected together, at any given time, other than the instant of switching, one transistor is "off" and the other is "on". Additional leakage current can only arise by inducing leakage through the "off" transistor. Additional electron-hole pairs reaching the depletion region 740 of active diffusion region 310 of the "on" transistor will not significantly impact the inverter leakage current which essentially is only influenced by characteristics of the "off" transistor.

This limitation that only "off" transistors and well diffusions can contribute to the BIC signal is of little consequence, as at any point in time, on average roughly half the transistors in a typical CMOS circuit are in the "off" state and are thus available to contribute leakage current for use with this technique.

Focused gallium ion beams are used in the most widely commercially available charged particle beam milling systems today and thus are good candidates for applying some preferred embodiments of this invention. However, those skilled in the art will recognize that other ion sources only available in laboratory settings today can be employed to take advantage of this invention, such as hydrogen, helium, neon, nitrogen, oxygen, argon, silicon, and gold ion sources.

Dual beam systems such as the FEI 200 DB from FEI Company of Beaverton, Oreg. provide both an ion beam and an electron beam, either independently or simultaneously. Those skilled in the art will recognize that either beam or a combination of both beams can be used to provide the BIC endpoint signal of the present invention.

As IC design rules continue to shrink, the increased precision and lower material removal rates achieved with chemically-assisted electron beam milling systems will become increasingly important, and are well suited to employ this invention for precise in-situ endpoint detection.

Although the foregoing is provided for purposes of illustrating, explaining, and describing certain embodiments of the precision in-situ endpoint detection technique in particular detail, modifications and adaptations to the described method and other embodiments will be apparent to those skilled in the art and may be made without departing from the scope or spirit of the invention. The scope of the invention should be construed in view of the claims.

With this in mind, we claim:

1. A process for cutting a trench in a backside of a substrate of an IC with precise in-situ endpoint detection, the process comprising:
   a. thinning the backside of the substrate;
   b. milling the trench on the backside of the substrate with a halogen-assisted charged particle beam, while modulating said charged particle beam at a reference frequency;
   c. monitoring an amplified endpoint signal induced by the modulated charged particle beam from the IC during the milling; and
   d. stopping the milling when the endpoint signal reaches a predetermined state.

2. The process of claim 1 wherein said step of modulating said charged particle beam at a reference frequency includes pulsing said charged particle beam with a beam blanker at said reference frequency.

3. The process of claim 1 wherein said step of modulating said charged particle beam at a reference frequency includes raster scanning said charged particle beam at a scanning frequency during milling, said reference frequency being derived from said scanning frequency.

4. The process of claim 1 wherein the charged particle beam is an electron beam.

5. The process of claim 1 wherein said step of monitoring an amplified endpoint signal includes amplifying said endpoint signal and monitoring the reference frequency in said endpoint signal.

6. The process of claim 5 wherein said amplifying of said endpoint signal comprises amplifying a frequency band approximately centered on said reference frequency.

7. The process of claim 6 including the step of providing a lock-in amplifier to amplify said frequency band; and
   generating the endpoint signal with said lock-in amplifier arranged to detect a power supply leakage current of the IC, and further arranged to amplify the reference frequency in said power supply leakage current.

8. The process as in claim 1, wherein the charged particle beam is an ion beam.

9. The process of claim 8 wherein the charged particle beam is a gallium ion beam with halogen-assistance from XeF2.

10. The process of claim 1 wherein the monitoring step further comprises processing the endpoint signal and displaying the endpoint signal.

11. The process of claim 10 wherein the processing in the monitoring step comprises subtracting the starting value of the endpoint signal.

12. The process of claim 1 wherein said thinning the backside of the substrate proceeds until said substrate has a thickness in the range between 20 and 200 $\mu$m.

13. The process of claim 12 wherein said thinning the backside of the substrate proceeds until said substrate has a thickness in the range between 50 and 150 $\mu$m.

14. A process for cutting a hole in a backside of a substrate of an IC to access a circuit element without unintentionally perturbing active diffusion regions of the IC by using precise in-situ endpoint detection, the process comprising:

a. thinning the backside of the substrate;
b. milling a first trench on the backside of the substrate;
c. milling a second trench within the first trench with a halogen-assisted charged particle beam while modulating the charged particle beam at a reference frequency;
d. generating an amplified endpoint signal with a lock-in amplifier, said lock-in amplifier arranged to detect and amplify the reference frequency in a power supply leakage current of the IC, said amplified endpoint signal being induced by the charged particle beam during the milling;
e. monitoring said amplified endpoint signal;
f. processing and displaying said amplified endpoint signal;
g. stopping the milling when said amplified endpoint signal reaches a predetermined state and
h. milling a hole within said second trench to access a circuit element.

15. The process of claim 14 wherein said IC is flip-chip mounted.

16. The process of claim 14 wherein the halogen-assisted ion beam is a gallium ion beam with halogen assistance from XeF2.

17. The process of claim 14, wherein said first trench has a first bottom surface, said first bottom surface after milling being a first distance from said active diffusion regions, said first distance being in the range between 2 and 20 $\mu$m.

18. The process of claim 14, wherein said second trench has a second bottom surface, said second bottom surface after milling being a second distance from said active diffusion regions, said second distance being in the range between 50 and 500 nm.

* * * * *